United States Patent [19]

Maruyama et al.

[11] Patent Number: 4,868,977

[45] Date of Patent: Sep. 26, 1989

[54] WORKING APPARATUS

[75] Inventors: Masahiro Maruyama, Minoo; Kanji Hata, Katano; Eiji Itemadani, Sakai; Yoshihisa Uchida, Neyagawa, all of Japan

[73] Assignee: Matsushita Electric Industrial Co., Ltd., Kadoma, Japan

[21] Appl. No.: 107,592

[22] PCT Filed: Nov. 27, 1985

[86] PCT No.: PCT/JP85/00655

§ 371 Date: Sep. 24, 1987

§ 102(e) Date: Sep. 24, 1987

[87] PCT Pub. No.: WO87/03234

PCT Pub. Date: Jun. 4, 1987

[51] Int. Cl.$^4$ ............................................ H05K 13/04
[52] U.S. Cl. ........................................ 29/823; 29/739; 29/832
[58] Field of Search ................. 29/822, 823, 739–740, 29/759, 760, 832

[56] References Cited

U.S. PATENT DOCUMENTS 4,202,092  5/1980  Shibasaki et al. ................. 29/741
4,231,153  11/1980  Browne ............................. 29/739

FOREIGN PATENT DOCUMENTS 0010131  8/1979  European Pat. Off. .
0076231  8/1982  European Pat. Off. .
2717035  10/1978  Fed. Rep. of Germany .
53-35348  9/1978  Japan .
57-036101  8/1982  Japan .

OTHER PUBLICATIONS

111 Werkstattstechnik, vol. 68, No. 11 (1979.11).
Supplementary European Search Report.

Primary Examiner—Howard N. Goldberg
Assistant Examiner—Taylor J. Ross
Attorney, Agent, or Firm—Cushman, Darby & Cushman

[57] ABSTRACT

The present invention relates to improvement in a working apparatus, such as an electronic part automatic-mounting apparatus comprising carriers for holding and moving works on a working line and a work head for applying a predetermined operation at a predetermined position on the work moved by the carriers, to a work station. The apparatus also includes: head driving means for moving the work head in directions (for examples, a Y direction) different from the moving direction of the work (for example, an X direction) and carrier driving means for moving the carriers along the working line sequentially from a work feed position to a work station, onto a work discharge position and then moving or restoring the work back to the work feed position (7). The carrier driving means also position the point of operation on the work in the moving direction fo the work at the work station. The working apparatus is so constructed that the carriers, during restoration movement, do not interfere with other carriers and works moved thereby. The present invention is characterized in that the loading time necessary to move a completed work from the work station and move the next work to the work station can be reduced considerably, thereby improving efficiency.

4 Claims, 7 Drawing Sheets

– 1 –

WORKING APPARATUS

TECHNICAL FIELD

The present invention relates to a working apparatus provided with carriers which hold works on a working line and transport them and with work heads which apply a predetermined operation at a predetermined position on the work transported to a work station on the working line.

Especially, the present invention is suitable for apparatus for automatically mounting electronic parts, such as a chip resistor or a chip laminated capacitor, on a substrate constituting an electronic circuit.

The present invention provides a working apparatus of good working efficiency, which reduces the leading time of moving the work to the work station and discharging it therefrom, thereby theoretically enabling the loading time to be zero. Especially, the present invention aims at a remarkable improvement in the work efficiency at the working apparatus, i.e. working time per one week.

BACKGROUND ART

As a conventional working apparatus of this kind, there is one as shown in FIG. 10.

The conventional apparatus relates to an automatic part mounting apparatus which picks up by a work head 51 an electronic part disposed on a part feed unit 50 and transports it into a work on a working line 52. More especially onto a substrate 53, thereby mounting the electronic part in a predetermined position on the substrate 53. The work head 51 moves in two horizontal directions X and Y to enable it to mount the electronic part on the substrate 53.

Further, the subtrate 53 is constructed so as to be positioned by a positioning means 55 in a predetermined stopped position at a work station 54 on the working line 52 to thereby be subjected to the mounting operation. The substrate 53 on which a necessary number of electronic parts are mounted is then moved on to a discharge position 56. Almost at the same time, the next substrate 53 at a stand-by position 57 is transported to the work station 54 and an electronic part is mounted similarly on the substrate 53. In addition, reference numeral 58 designates a stopper for stopping the next substrate 53 in the stand-by position 57.

The aforesaid conventional apparatus takes a relatively long loading time to move the substrate 53 on which the mounting operation has been completed from the work station 54 and to move a new substrate 53 thereto, e.g. such as several seconds to about 5 seconds.

Accordingly, when the number of parts to be mounted on one substrate is small, a loss in the loading time seriously affects work efficiency and decreases it considerably.

In the graph in FIG. 9 the abscissa represents the number of parts mounted on one substrate and the ordinate represents the number of parts mounted in 400 minutes of operating time. The solid line shows the work efficiency of the conventional apparatus while the dot-dash line shows the work efficiency of apparatus embodying this invention. The aforesaid problem can be apparently seen from this graph.

SUMMARY OF THE INVENTION

The present invention has been designed to eliminate the defect in conventional apparatus and is characterized in that a working apparatus which is provided with carriers for holding works on a working line and discharging the works and with work heads each applying a predetermined operation on a predetermined position on the work transported to a work station on the working line, is constructed as follows:

A work head is constructed to apply the predetermined operation at the predetermined position on a work and moves in a different direction from the moving direction of the work at the work station. The work and work head may be moved in two directions in the horizontal plane, namely X and Y directions, that is, the work in the direction X and the work head in the direction Y.

A head driving means for moving the work head and positioning the point of operation in the direction Y is provided.

Plural carriers are provided for holding the works on the working line and transporting them. The usual, two first and second carriers may be provided.

The two carriers are moved along the working line sequentially toward the work feed position to the work station and to the work discharge position in that order and restored or moved back therefrom to the work feed position. In order to position the point of operation in the direction X at the work area at every operation, carrier driving means are provided for each of the two carriers. Normally, a first carrier driving means is provided for the first carrier and a second carrier driving means for the second carrier.

Furthermore, the two carriers are constructed not to interfere, during restoration, with other carriers and work.

The present invention is further specifically constituted as shown schematically by an embodiment in FIGS. 1 through 7, in which the respective carriers 6a and 6b move in reciprocation between the work feed position 7, the work station 3 and the work discharge position 8 and travel on paths on which main bodies of the carriers 6a and 6b do not interfere with each other and work holders 11 on the carriers 6a and 6b change their postures so as not to interfere with other carriers 6b and 6a and work 1.

A modified mode of the present invention is shown in FIG. 8, in which the carriers 6a and 6b move in an endless path and in circulation between the work feed position 7, work station 3 and the work discharge position 8. In this case, carrier driving means 9a and 9b for driving the carriers 6a and 6b, respectively, are preferred to be composed of endless timing belts 31a and 31b independent of each other and pulse motors 32a and 32b.

The present invention being constructed as abovementioned, for example, as shown in FIGS. 1 to 3, the first and the second carriers 6a and 6b can each be moved independently and accurate operations can be applied at the predetermined position of the X-Y coordinates on the work 1 positioned at the work station 3 and reduction in the loading time can be expected.

In FIG. 1, the work 1 designated by P is held on the first carrier 6a and position at the work station 3. The work head 2 functions to move in the direction Y, pick up a predetermined part from a part feed unit 12, transport the part to the work station 3, and mount the same in the predetermined position on work P. The work head 2 at the work area 3 carries out the mounting operation by positioning the work at the point of operation in the direction Y, at which time the first carrier 6a is positioned at the point of operation in the direction X. Hence, the part mounting operation by the work head 2 is carried out at an accurate point on the work P.

On the work P a predetermined number of mounting operations are carried out, and during each operation work head 2 moves in reciprocation on a part transporting line L, and on the other hand the work P is gradually moved step-by-step to the right as shown in the drawings.

When the part mounting operations are being carried out with respect to the work P, the next work 1 designated by Q is held to the second carrier 6b at the work feed position 7 and then as shown in FIG. 2, moves to a position close to the work P just before the completion of the part mounting operations on work P.

When the part mounting operations with respect to the work P are completed, the first carrier 6a moves toward the work discharge position 8 and places the work P on a discharge side conveyor 13 on which the work P is transported outside the working line 5. Simultaneously, the work G is moved to the work station 3 by the second carrier 6b and subjected to the part mounting operations by the work head 2 as shown in FIG. 3.

While the work Q is being subjected to the part mounting operations, the first carrier 6a is moved back from the work discharge position 8 to the work feed position 7 and receives the next work 1 which is designated by R and supplied by a feed side conveyor 14. Thereafter, the operations shown in FIGS. 1 to 3 are repeated.

The first carrier 6a is constructed so as not to interfere with the second carrier 6b and the work Q held thereon during movement back or restoration to the feed position 7, whereby the restoration movement can be made smoothly. Similarly, the restoration movement of the second carrier 6b can be made smoothly.

Thus, according to the present invention, upon ending the operations on work 1 held by the first carrier 6a (or the second carrier 6b), a transferring of part mounting operations to the work 1 held to the second carrier 6b (or the first carrier 6a) can be made almost without the need of any loading time. Hence, as shown by the dot-dash line in the graph of FIG. 9, the work efficiency can ideally be kept high regardless the number of part mounting operations per one work 1.

BEST MODE FOR CARRYING OUT THE INVENTION

Referring to FIGS. 1 through 7 the first embodiment of a working apparatus in accordance with the present invention is an electronic part mounting apparatus for automatically sequentially mounting a large number of electronic parts (to be hereinafter called the parts) 15 (refer to FIG. 5) onto predetermined positions on a substrate 1 (to be hereinafter called the work).

Figure 4:
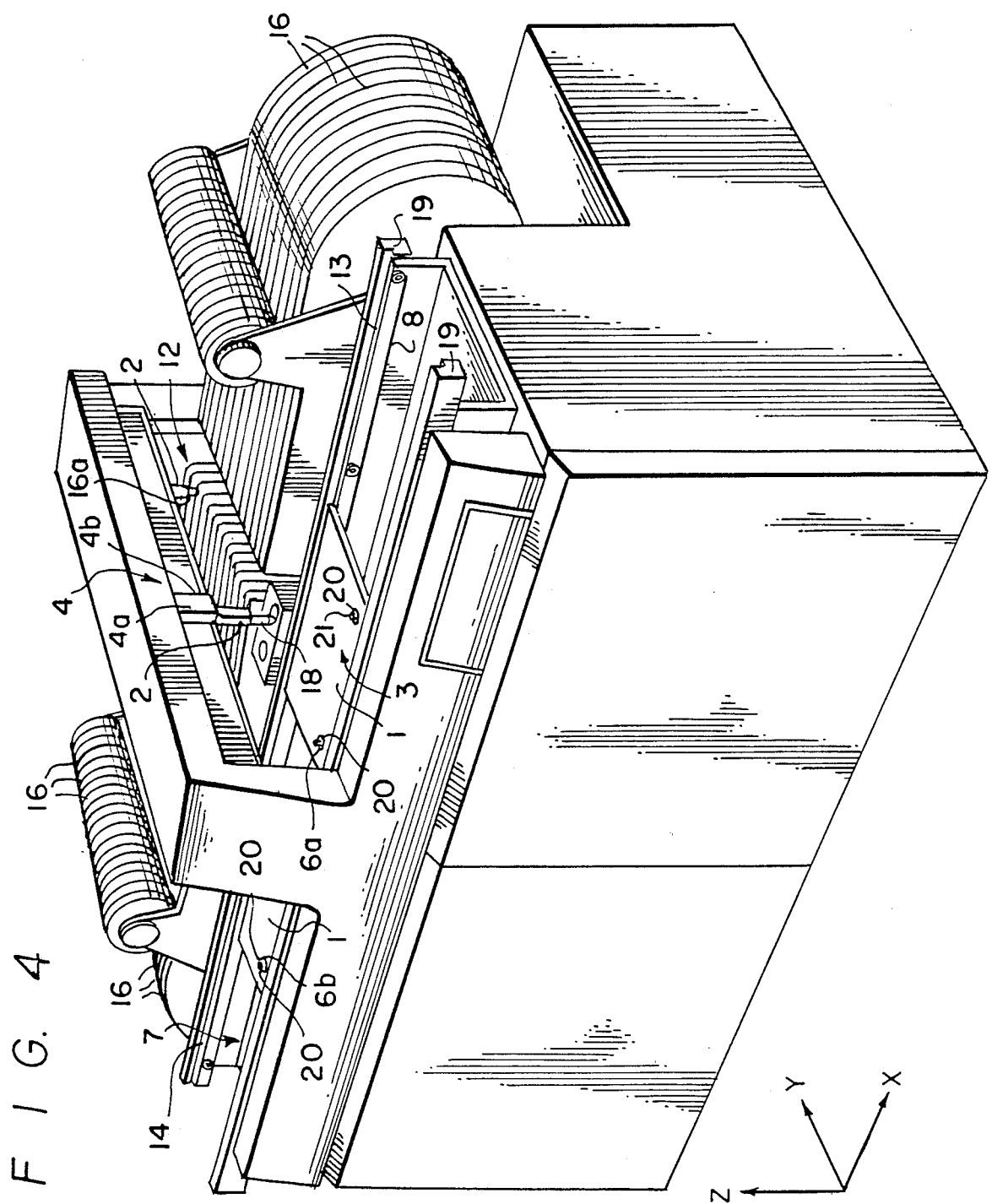
FIG. 4 is a detailed partly schematic perspective view of the first embodiment.
Figure 5:
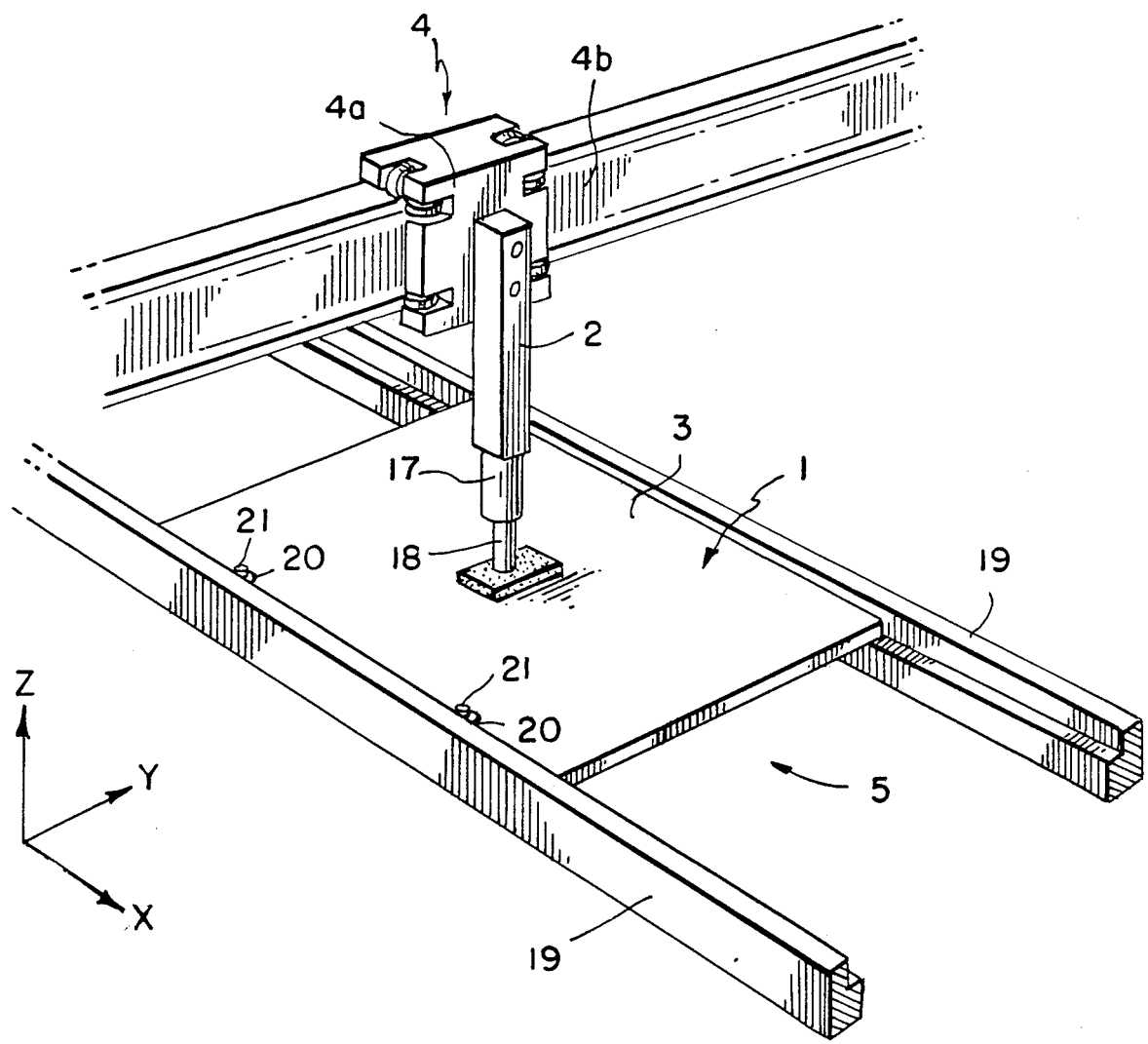
FIG. 5 is an enlarged fragmentary perspective view of the work head and working line shown in FIG. 5.

This embodiment, as shown in FIG. 4, comprises two part feed units 12, 12 on one side of a working line 5, two work heads, 2, 2 corresponding to the part feed units 12, 12, respectively, and a pair of head driving means 4, 4. When one work head 2 picks up a part 15 from one part feed unit 12, the other work head 2 carries out the operation of mounting a part on the work 1 at the work station on the working line 5. Thus, both the work heads 2, 2 carry out basically the same motions and operations but the timings are different by a half cycle from each other, thereby improving the efficiency for the part mounting operation.

At each part feed unit 12 are disposed in parallel a large number of taping cassette units 16, the tape 16a in each taping cassette holding thereon many parts 15 in alignment. The tape 16a is moved step-by-step in the direction so that one of the parts 15 reaching the pick-up position is picked up selectively by the work head 2 for each mounting operation. The parts 15 at the pick-up position on each tape 16a are nearly aligned on the part transporting line L (refer to FIG. 1).

Each work head 2 picks up a part 15 from each part feed unit 12, transports it to the work station 3 on the working line 5 and mounts the part 15 at a predetermined position on the work 1. Each work head 2, as detailed in FIG. 5, comprises a head body 17 and a suction nozzle 18 movable vertically or in the Z direction with respect to the head body 17, the suction nozzle 18 using vacuum pressure to pick up the part 15 from the tape 16a.

The head driving means 4, which controls the movement of the work head 2 in the Y direction, is composed of a linear pulse motor comprising a movable unit 4a which carries the head body 17 and a fixed unit serving as a guide rail 4b. The unit 4a controls the position and the moving speed of the work head 2 in the Y direction by a pulse signal from a control device (not shown). In addition, the suction nozzle 18 moves in the Z direction by driving means (not shown), such as an air cylinder, under control of the control device.

Figure 6:
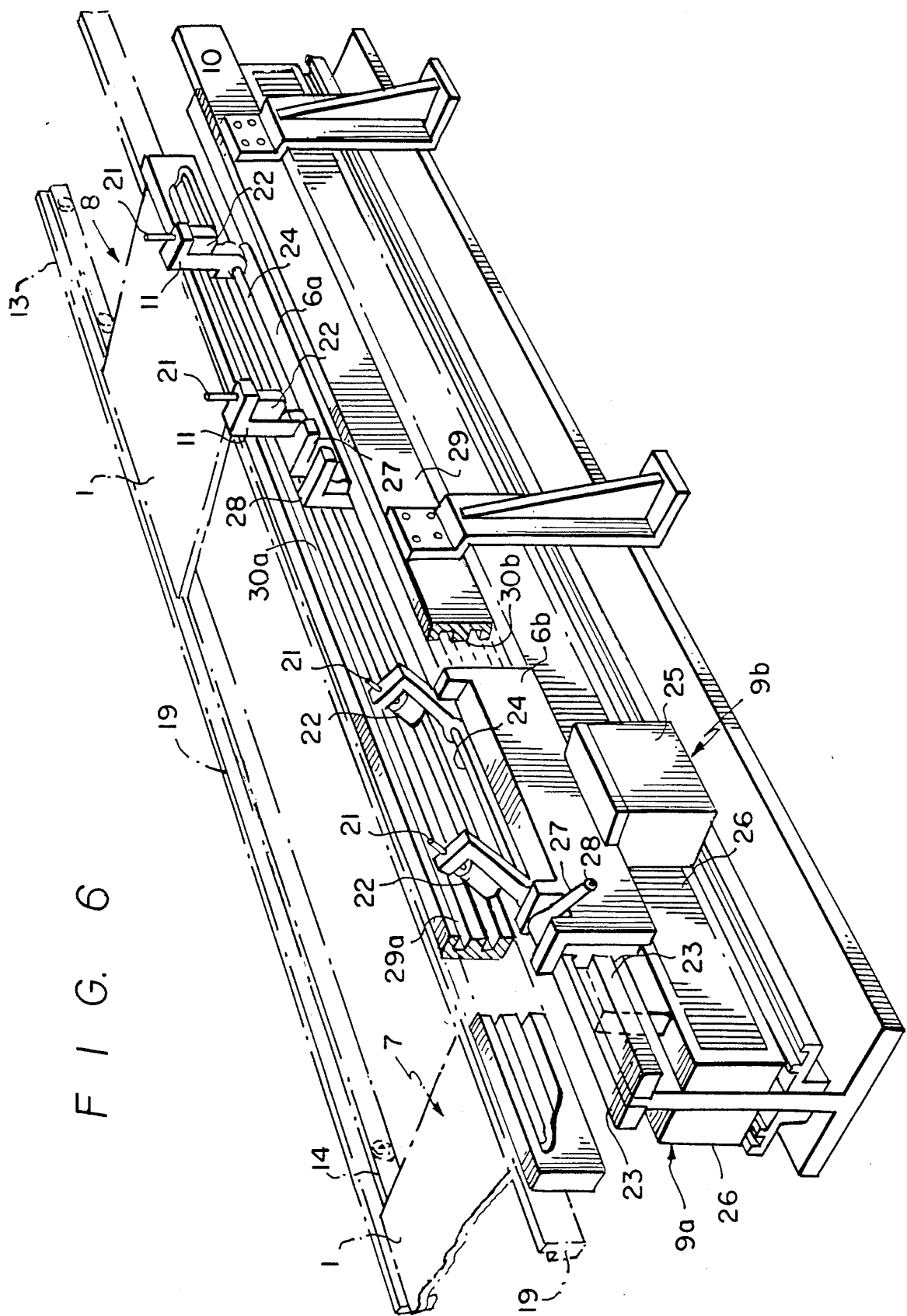
FIG. 6 is an enlarged fragmentary perspective view of the carrier driving means shown in FIG. 5.
Figure 7:
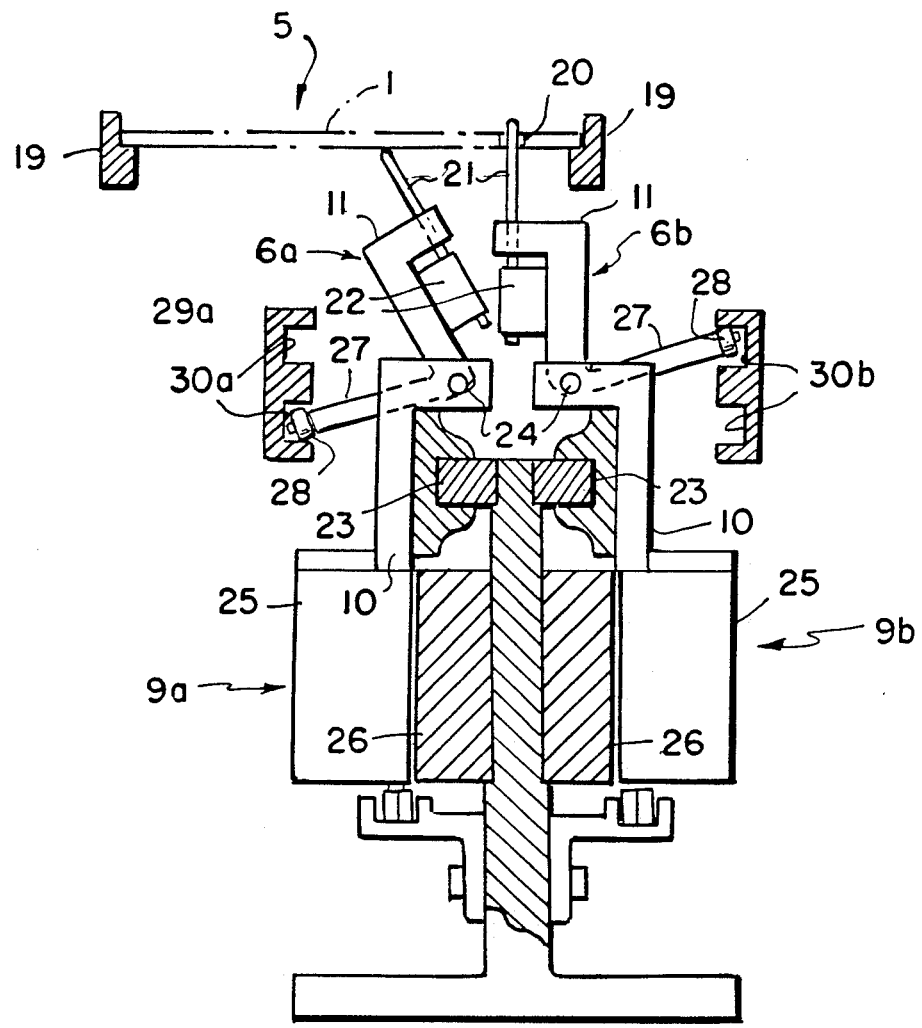
FIG. 7 is an enlarged sectional view of the carriers and carrier driving means shown in FIG. 6.

On the working line 5 extending in the X direction, as shown in FIGS, 4 through 7, are disposed a pair of guide rails 19, 19 for supporting and guiding the work 1, on the feed side conveyor 14 for feeding the work 1 into the line 5, and a discharge side conveyor 13 for discharging the work 1 on completion thereon of the part mounting operations at the work station 3. Also, on the working line 5 are disposed a pair of a first and a second work carriers 6a and 6b. Also, as shown in FIGS. 6 and 7, there are a first carrier driving means 9a and a second carrier driving means 9b which move the carriers 6a and 6b in succession from the work feed position 7, to the work station 3 and to the work discharge position 8 along the working line 5 and further move them back from the work discharge position 8 to the work feed position 7 and also position the point of operation of each work 1 at the work station 3 at every mounting operation.

Both the carriers 6a and 6b each comprise two retractive pins 21, a pair of work holders 11 each having a solenoid 22 for projecting and retracting the corresponding retractive pin 21, and two carrier bodies 10 moving on opposite sides of and along a guide rail 23 in the X direction. Both carrier bodies 10, 10 move in reciprocation along the rail 23 so as not to interfere with each other. The retractive pins 21 detachably engage with a pair of spaced holes 20 in each work 1.

Each work holder 11 is supported laterally swingably on a pivot shaft 24 journalled on the carrier body 10. Fixed to the pivot shaft 24 is a swinging lever 27 having a roller cam follower 28 at its outer end. The follower 28 of the carrier 6a rides in a cam groove 30a in a cam plate or rail 29a on one side of the rail 23 while the follower of the carrier 6b rides in a cam groove 30b in a cam plate on rail 29b on the other side of the rail 23. The cam grooves 30a and 30b, as shown in FIG. 6, are each endless, i.e. having upper and lower runs connected at their ends.

The first and second carrier driving means 9a and 9b each includes a linear pulse motor comprising a movable unit 25 fixed to the carrier body 10 and a rail-like fixed unit 26 extending parallel to and below the guide rail 23. The carrier driving means 9a and 9b move the first and the second carriers 6a and 6b independently in the X direction, position them, and control their moving speeds by a pulse signal from the control device.

Figure 1:
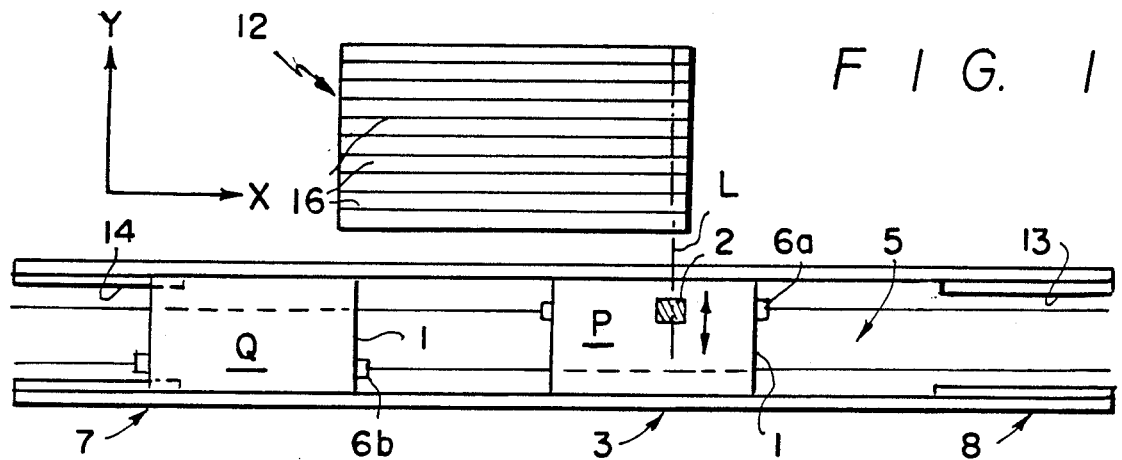
FIGS. 1, 2 and 3 are schematic plan views of a first embodiment of a working apparatus embodying this invention, showing the principle and operation thereof.
Figure 2:
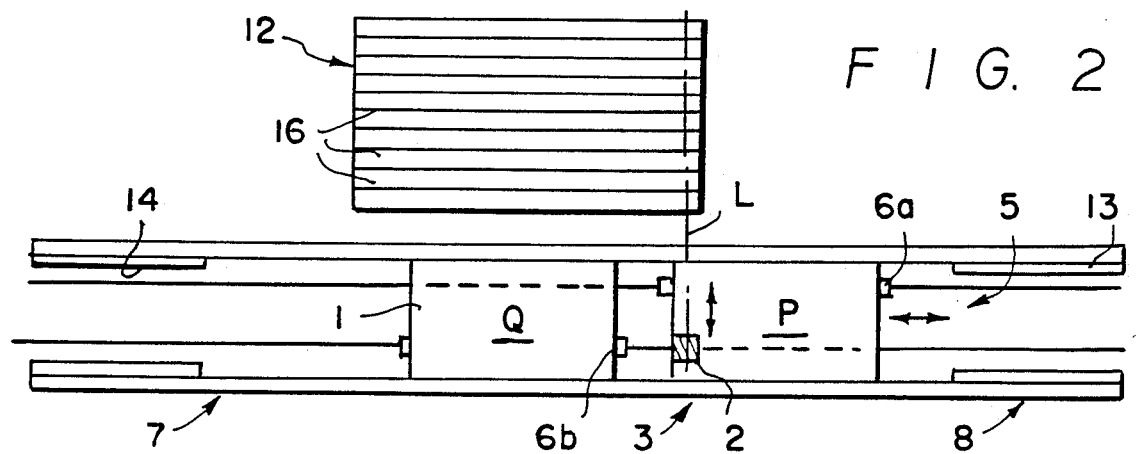
Figure 3:
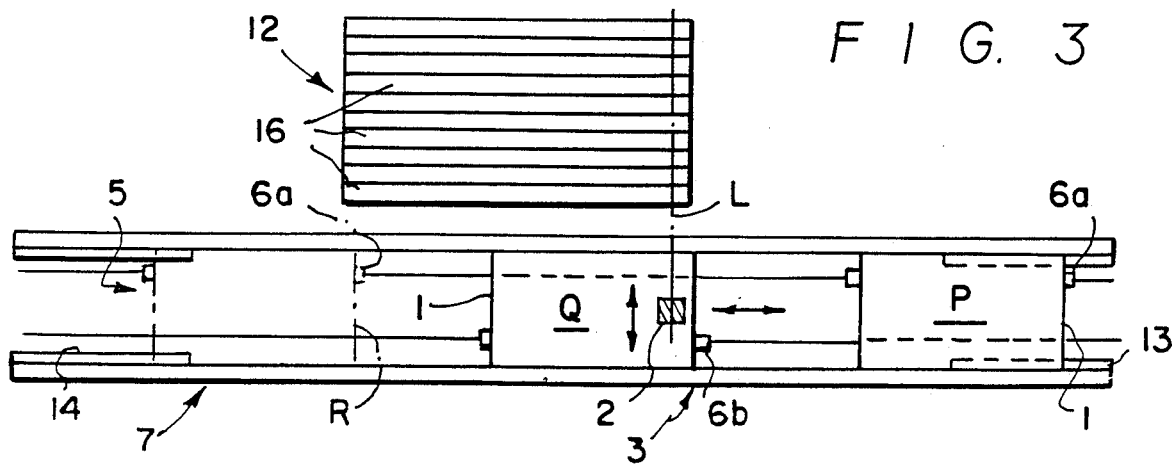

The first carrier 6a, as shown in FIGS. 1 through 3, is driven by the first driving means 9a to move from the work feed position 7, to the work station 3 and to the work discharge position 8. During that time, the work holder 11 of the first carrier 6a is upright because the cam follower 28 of that carrier rides in the upper run of the cam groove 30a in the cam plate 29a as shown in FIG. 6. When the feed-in side conveyor 14 transfers a work 1 to the first carrier 6a at the work feed position 7, the solenoids 22 of that carrier project the retractive pins 21 to engage in the holes 20 in the work 1, thereby fastening the work 1 to the first carrier 6a. The first carrier 6a is, at the work station 3, positioned at the point of operation in the X direction for every part mounting operation and the work head 2 is positioned at the point of operation in the direction for every part mounting operation to that mount the parts 15 at the predetermined points on the coordinates X-Y on the work 1. At the work delivery position 8, the solenoids 22 retract the retractive pins 21 from engagement with the holes 20, and thereafter, the work 1 on the first carrier 6a is transferred onto the discharge side conveyor 13. At this time, as shown in FIG. 7, the cam follower 28 of the first carrier 6a moves down into the lower run of the cam groove 30a, whereby the work holder 11 tilts away from the path of the other carrier 6b. Hence, the first carrier 6a can be restored or moved back to the work feed position 7 without interfering with the second carrier 6b and the work 1 moved thereby.

The second carrier 6b is driven, independently of the first carrier 6a, and is moved by the second carrier driving means 9b. Since the basic function of the second carrier 6b is the same as the first carrier 6a, the operation of the second carrier need not be detailed. The relation between the first carrier 6a and the second carrier 6b is as described in the above Summary of the Invention referring to FIGS. 1 through 3.

Figure 8:
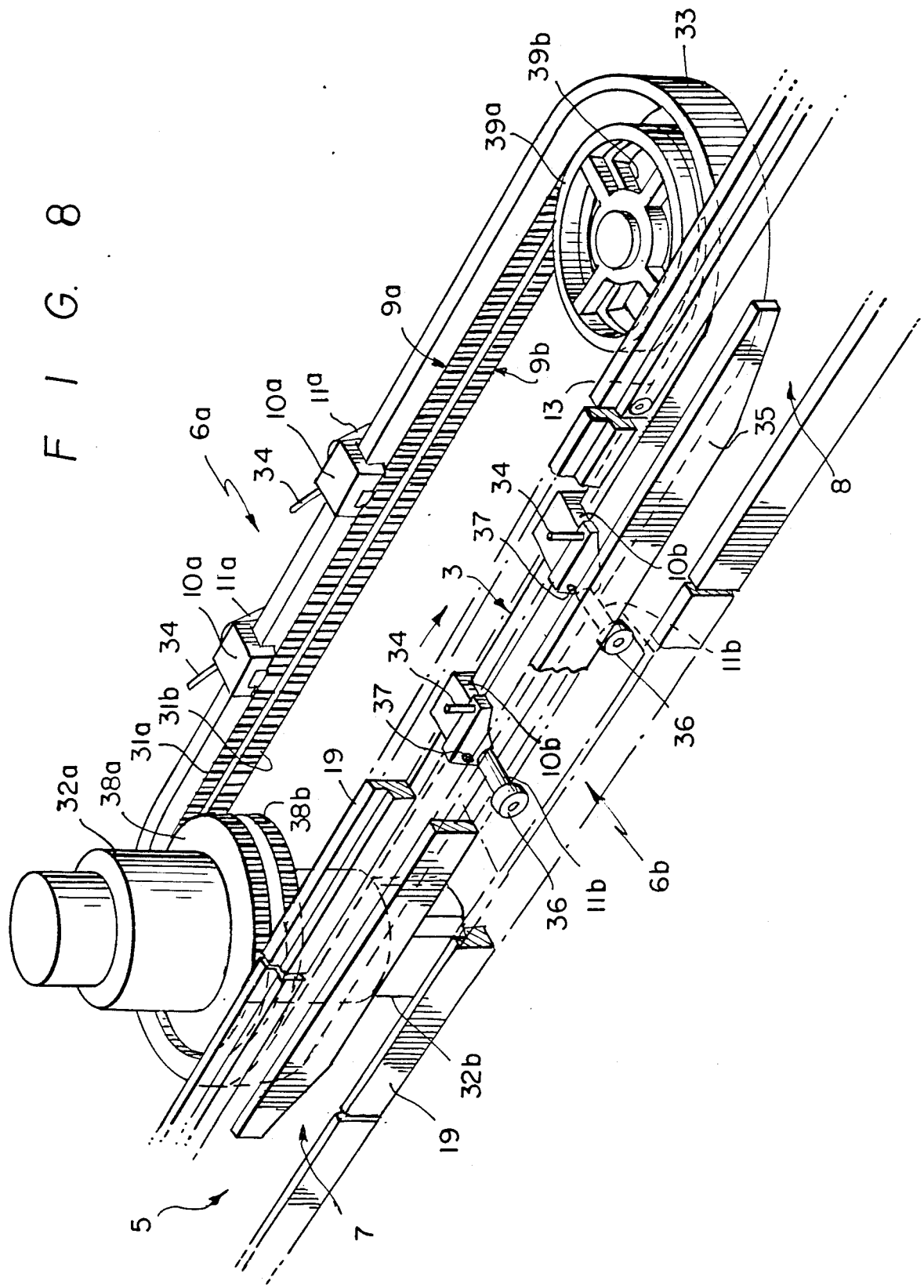
FIG. 8 is a perspective view of a modified form of carriers and carrier driving means constituting a second embodiment this invention.
Figure 9:
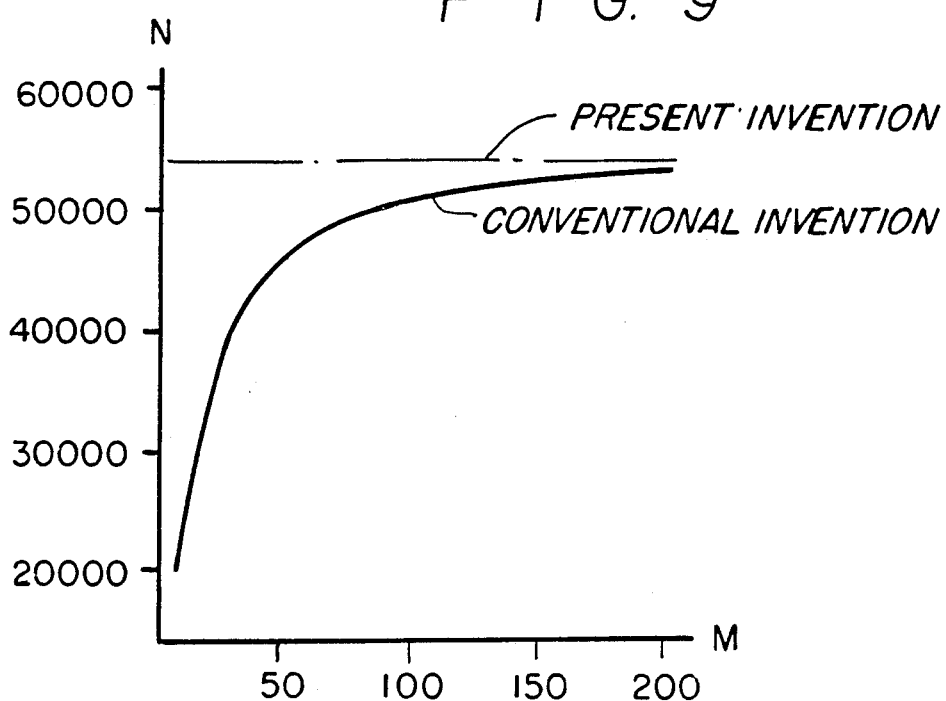
FIG. 9 is a graph comparing the work efficiency of the present invention with that of the conventional example.
Figure 10:
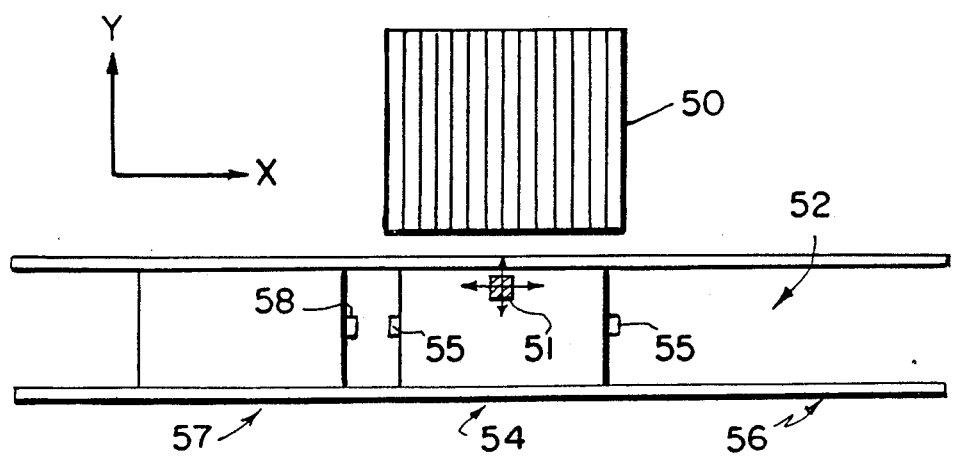
FIG. 10 is a schematic plan view of the conventional example showing the principle of operation thereof.

Referring now to FIG. 8, there is shown a second embodiment of this invention including a first carrier 6a, a second carrier 6b, a first carrier driving means 9a and a second carrier driving means 9b. The first carrier driving means 9a comprises a first endless timing belt 31a, trained over a driving wheel 38a and an idler wheel 39a, and a first pulse motor 32a for unidirectionally rotatably driving the wheel 38a and the belt 31a. The belt 31a has fixed thereon a pair of carrier bodies 10a, 10a guided by an endless rail 33 so as to circulatingly move to the work feed position 7, the work station 3 and the work discharge position 8. To each carrier body 10a is swingably pivoted a work holder 11a having a pin 34 to engage a corresponding hole in the work. The work holder 11a has a cam follower 36 provided with a return spring 37. A cam plate 35 is disposed along the working line 5 engageable by the followers 36 so that the pins 34 stand upright while moving from the work feed position 7 to the work discharge position 8 to thereby engage with an engaging hole 20 in the work 1.

The first carrier 6a, as above-mentioned, comprises the pair of carrier bodies 10a, 10a and work holders 11a, 11a. The second carrier 6b comprises a pair of carrier bodies 10b, 10b fixed to a second endless timing belt 31b and work holders 11b pivoted to the carrier bodies 11b respectively. A second driving means 9b comprises the second endless timing belt 31b trained over a driving wheel 38b and a driven wheel 39b respectively coaxial with the wheels 38a and 39a, and a second pulse motor 32b for unidirectionally rotatably driving wheel 38b and the belt 31b independently of the belt 31a.

Thus, the first and second carriers 6a and 6b circulate in one direction without interfering with each other in moving from the work feed position 7, to the work station 3 and to the work discharge position 8 and back to the position 7, thereby functioning the same as the first embodiment.

Other than the embodiments described above, the present invention can be constituted in various modes. For example, three or more sets of the carriers 6a and 6b and carrier driving means 9a and 9b may be provided. Though the moving direction of the work head 2 in the aforesaid embodiments is in the Y direction and that of the work 1 in the work station in the X direction, it is not necessary that these two directions are perpendicular to each other. Though in the above-mentioned embodiments, the work 1 is moved by the carriers 6a and 6b through an engagement of retractive pins 21 or 34 in holes 20 in the work 1, other constructions are possible such that the work 1 is held and moved by use of clamping means or the like. Also, the present invention may be applicable to other apparatus, such as a soldering apparatus or a boring apparatus.

As seen from the above, the present invention has the following advantages:

The loading time of discharging the completed work from the work station moving thereto the next work is greatly reduced from that of the conventional example, thereby enabling the work efficiency to be improved. Especially when the number of points of operating per one work is small, the work efficiency will be remarkably improved.

The work head needs only be moved unidirectionally, the construction can be simplified and made lightweight in comparison with the conventional work head which necessitates moving in two directions.

We claim:

1. In a working apparatus comprising carriers for holding and moving works along a working line and a work head for applying predetermined operations at predetermined positions on a work at a work station on said line, the improvement comprising:

head driving means for moving said work head in a direction different from the moving direction of a work at said work station and positioning said head in its said moving direction for a point of operation at a predetermined position on the work for each operation, plural carriers for moving works sequentially from a work feed position to said work station and on to a work discharge position, carrier driving means for each of said carriers for moving said carriers independently of each other along said working line sequentially from said work feed position to said work station, on to said work delivery position, and back to said work feed position, and for positioning each carrier in its said moving direction for a point of operation at a predetermined position on the work carried by the carrier at said work station for each operation.

2. The apparatus defined in claim 1 including means for changing the posture of the carriers during movement back to the work feed position to avoid interference with other carriers and works being held and moved thereby.

3. The apparatus defined in claim 2 in which the posture-changing means includes a fixed endless cam groove and a cam follower on each carrier riding in said groove.

4. The structure defined in claim 1 in which each carrier driving means includes an endless belt and a pulse motor for driving said belt independently of any other driving means.

* * * * *